United States Patent
Johnson et al.

(10) Patent No.: US 12,243,610 B2
(45) Date of Patent: Mar. 4, 2025

(54) MEMORY WITH PARALLEL MAIN AND TEST INTERFACES

(71) Applicant: Micron Technology, Inc., Boise, ID (US)

(72) Inventors: James Brian Johnson, Boise, ID (US); Kunal R. Parekh, Boise, ID (US); Brent Keeth, Boise, ID (US); Eiichi Nakano, Boise, ID (US); Amy Rae Griffin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 129 days.

(21) Appl. No.: 17/821,676

(22) Filed: Aug. 23, 2022

(65) Prior Publication Data
US 2024/0071556 A1  Feb. 29, 2024

(51) Int. Cl.
G11C 29/00 (2006.01)
G11C 7/10 (2006.01)
G11C 29/56 (2006.01)

(52) U.S. Cl.
CPC ...... G11C 29/56004 (2013.01); G11C 7/1039 (2013.01); G11C 29/56016 (2013.01); *G11C 2029/5602* (2013.01)

(58) Field of Classification Search
CPC ............ G11C 29/56004; G11C 7/1039; G11C 29/56016; G11C 2029/5602; G11C 5/04; G11C 29/1201; G11C 29/48
See application file for complete search history.

(56) References Cited

U.S. PATENT DOCUMENTS

| | | | | |
|---|---|---|---|---|
| 2007/0279079 A1* | 12/2007 | Chang | .................... | G11C 29/48 324/762.06 |
| 2017/0154655 A1* | 6/2017 | Seo | ......... | G11C 5/141 |
| 2020/0365210 A1* | 11/2020 | Chibvongodze | ......... | G11C 7/06 |
| 2021/0286904 A1* | 9/2021 | Cariello | .................. | G06F 21/79 |

* cited by examiner

Primary Examiner — Mushfique Siddique
(74) Attorney, Agent, or Firm — Holland & Hart LLP

(57) ABSTRACT

Methods, systems, and devices for memory with parallel main and test interfaces are described. A memory die may be configured with parallel interfaces that may individually (e.g., separately) support evaluation operations (e.g., before or as part of assembly in a multiple-die stack) or access operations (e.g., after assembly in a multiple die stack). For example, a memory die may include a first set of one or more contacts that support communicating signaling with or via another memory die in a multiple-die stack. The memory die may also include a second set of one or more contacts that support probing for pre-assembly evaluations, which may be electrically isolated from the first set of contacts. By implementing such parallel interfaces, evaluation operations may be performed using the second set of contacts without damaging the first set of contacts, which may improve capabilities for supporting a multiple-die stack in a memory device.

12 Claims, 6 Drawing Sheets

MEMORY WITH PARALLEL MAIN AND TEST INTERFACES

FIELD OF TECHNOLOGY

The following relates to one or more systems for memory, including memory with parallel main and test interfaces.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
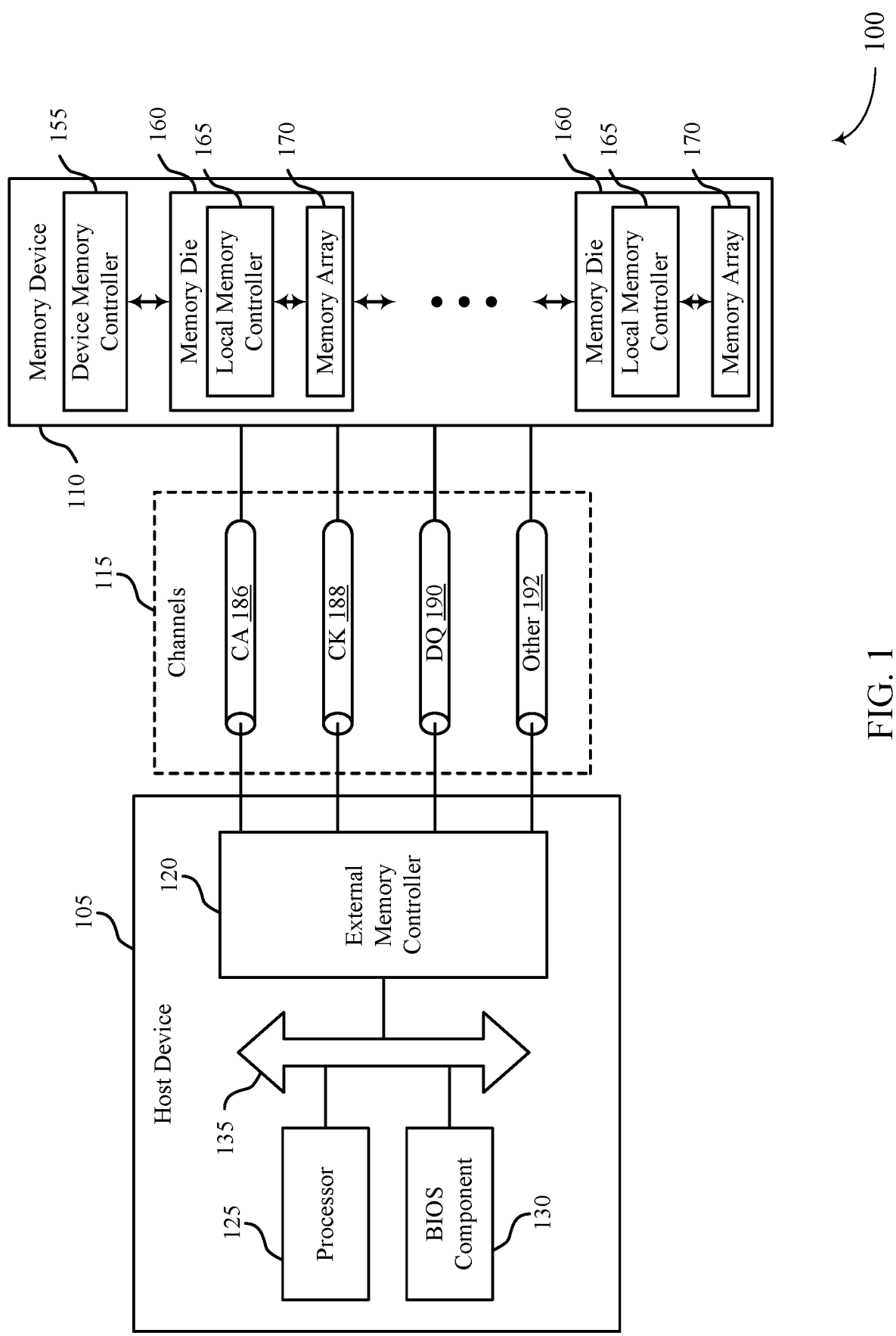
FIG. 1 illustrates an example of a system that supports memory with parallel main and test interfaces in accordance with examples as disclosed herein.

In some implementations, a memory device may include an interconnected stack of multiple semiconductor dies (e.g., semiconductor chips, memory dies), which each may support a functionality of the memory device. For example, each memory die may include an array of memory cells and various circuitry (e.g., access circuitry, control circuitry, signaling circuitry) that supports various access operations (e.g., write operations, read operations) on the array of memory cells. Such a memory device may provide an aggregate storage capacity or throughput of multiple memory dies in a stacked arrangement, which may leverage performance characteristics of multiple semiconductor substrates, such as transistor performance characteristics associated with a crystalline semiconductor of a respective semiconductor substrate.

Memory dies configured for integration in a multiple-die stack may include contacts (e.g., electrical contacts, contact pads) that support signaling between or via one or more other memory dies in a stack. In some examples, performance characteristics of such memory dies may be evaluated (e.g., tested, validated, confirmed) before or as part of assembly in a multiple-die stack using such contacts. However, probing of contacts of a memory die (e.g., by an evaluation probe) may cause damage to the contacts (e.g., deformation, composition changes), which may render the contacts less effective or inoperable or less effective for some types of interconnections between memory dies.

In accordance with examples as disclosed herein, a memory die may be configured with parallel interfaces (e.g., parallel sets of contacts) that may individually (e.g., separately) support evaluation operations (e.g., before or as part of assembly in a multiple-die stack) or access operations (e.g., after assembly in a multiple die stack). For example, a first memory die may include a first set of one or more contacts that support communicating signaling with or via another memory die in a multiple-die stack (e.g., in a mission mode). The first memory die may also include a second set of one or more contacts that support probing for pre-assembly evaluations (e.g., in a test mode, for contact with an evaluation probe), which may be electrically isolated from the first set of contacts. By implementing such parallel interfaces, evaluation operations may be performed using the second set of contacts without damaging the first set of contacts, which will improve capabilities for supporting a multiple-die stack in a memory device. For example, the first set of contacts may be configured with a smaller cross-sectional area (e.g., contact area), with a reduced spacing, with a greater quantity of contacts, or any combination thereof, which may be supported by relatively precise techniques for bonding between contacts of opposed memory dies that might otherwise be unavailable in the presence of damage (e.g., due to evaluation probing). In some examples, such improvements to the first set of contacts will support a higher throughput (e.g., a higher bit rate, a higher burst rate) of the memory device, a reduced power consumption of the memory device, or a reduced heating of the memory device, among other benefits.

Features of the disclosure are initially described in the context of systems and dies as described with reference to FIGS. 1 and 2. Features of the disclosure are described in the context of a data path, a device, and a layout with reference to FIGS. 3 through 5. These and other features of the disclosure are further illustrated by and described with reference to a flowchart that relates to memory with parallel main and test interfaces as described with reference to FIG. 6.

FIG. 1 illustrates an example of a system 100 that supports memory with parallel main and test interfaces in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 may include a local memory controller 165 and a memory array 170. A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some implementations, a memory device 110 may include multiple memory dies 160 that are configured in a stacked configuration (e.g., with one memory die 160 stacked over another memory die 160). Memory dies 160 that are configured in such aa manner may include contacts (e.g., electrical contacts, contact pads) that support signaling between or via one or more other memory dies 160 in the stack. In some examples, performance characteristics of such memory dies 160 may be evaluated (e.g., tested, validated, confirmed) before or as part of assembly in a multiple-die stack using such contacts. However, probing of contacts of a memory die 160 (e.g., by an evaluation probe) may cause damage to the contacts (e.g., deformation, composition changes), which may render the contacts less effective or inoperable for some types of interconnections between memory dies 160 in the memory device 110.

In accordance with examples as disclosed herein, memory dies 160 may be configured with parallel interfaces (e.g., parallel sets of contacts) that may individually (e.g., separately) support evaluation operations (e.g., before or as part of assembly in a multiple-die stack) or access operations (e.g., after assembly in a multiple die stack, in response to commands from a host device 105). For example, a memory die 160 may include a first set of one or more contacts that support communicating signaling with or via another memory die 160, or a die associated with a device memory controller 155, in a multiple-die stack (e.g., in a mission mode). The memory die 160 may also include a second set of one or more contacts that support probing for pre-assembly evaluations (e.g., in a test mode, for contact with an evaluation probe), which may be electrically isolated from the first set of contacts. By implementing such parallel interfaces, evaluation operations may be performed on the memory die 160 using the second set of contacts without damaging the first set of contacts, which will improve capabilities of the memory die 160 for supporting a multiple-die stack in a memory device 110. For example, the first set of contacts may be configured with a smaller cross-sectional area (e.g., contact area), with a reduced spacing, with a greater quantity of contacts, or any combination thereof, which may be supported by relatively precise techniques for bonding between contacts of opposed memory dies 160 that might otherwise be unavailable in the presence of damage (e.g., due to evaluation probing). In some examples, such improvements to the first set of contacts will support a higher throughput (e.g., a higher bit rate, a higher burst rate) of the memory device 110, a reduced power consumption of the memory device 110, or a reduced heating of the memory device 110, among other benefits.

Figure 2:
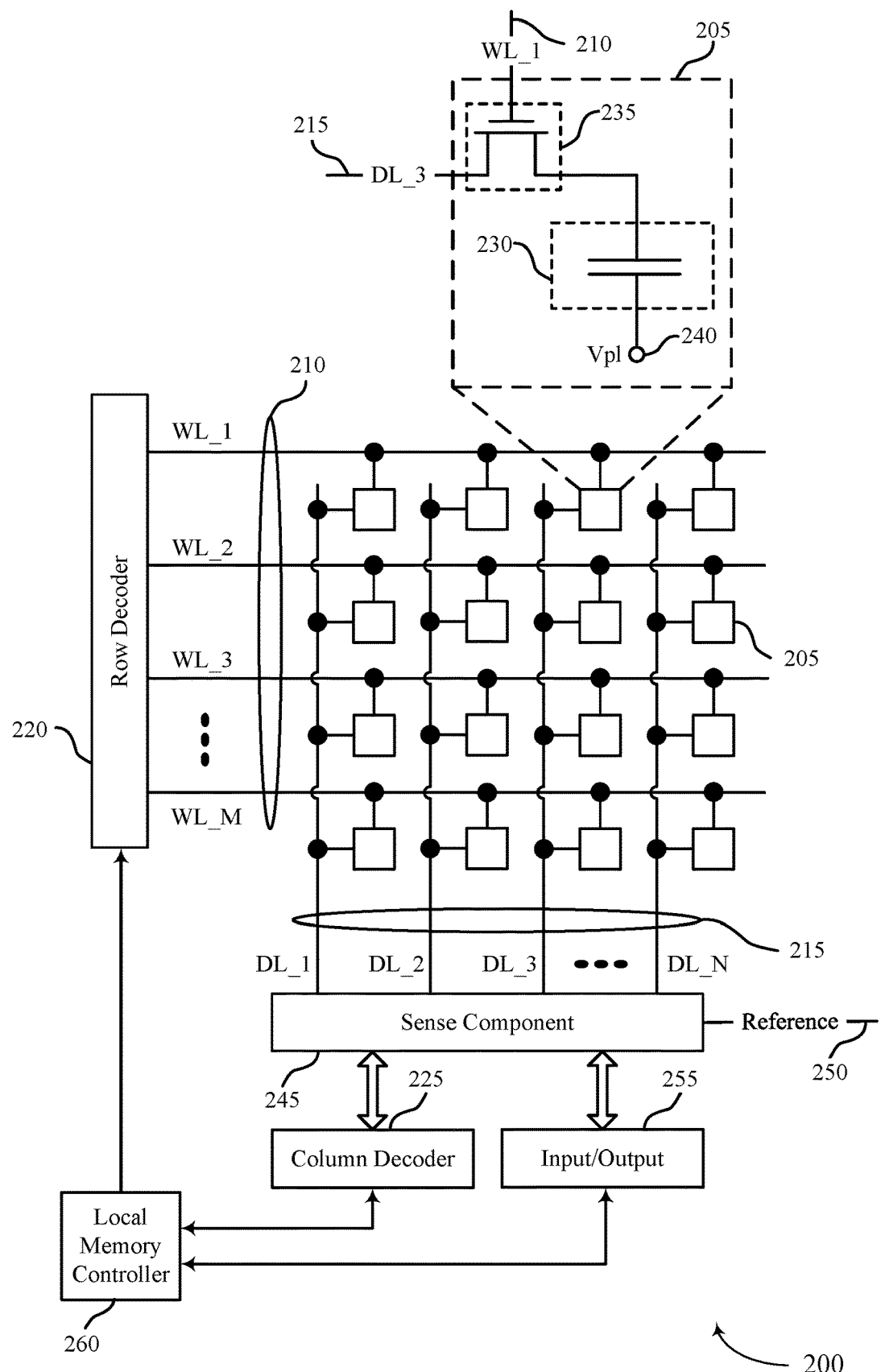
FIG. 2 illustrates an example of a memory die that supports memory with parallel main and test interfaces in accordance with examples as disclosed herein.

FIG. 2 illustrates an example of a memory die 200 that supports memory with parallel main and test interfaces in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor.

A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In accordance with examples as disclosed herein, the memory die 200 may be configured with parallel interfaces (e.g., parallel sets of contacts) that may individually (e.g., separately) support evaluation operations (e.g., before or as part of assembly in a multiple-die stack) or access operations (e.g., after assembly in a multiple die stack, in response to commands from a host device 105). For example, the memory die 200 may include a first set of one or more contacts that support communicating signaling with or via another memory die 200, or a die associated with a device memory controller 155, in a multiple-die stack (e.g., in a mission mode). The memory die 200 may also include a second set of one or more contacts that support probing for pre-assembly evaluations (e.g., in a test mode, for contact with an evaluation probe), which may be electrically isolated from the first set of contacts. By implementing such parallel interfaces, evaluation operations may be performed on the memory die 200 using the second set of contacts without damaging the first set of contacts, which will improve capabilities of the memory die 200 for supporting a multiple-die stack in a memory device 110. For example, the first set of contacts may be configured with a smaller cross-sectional area (e.g., contact area), with a reduced spacing, with a greater quantity of contacts, or any combination thereof, which may be supported by relatively precise techniques for bonding between contacts of opposed memory dies 200 that might otherwise be unavailable in the presence of damage (e.g., due to evaluation probing). In some examples, such improvements to the first set of contacts will support a higher throughput (e.g., a higher bit rate, a higher burst rate) of the memory device 110, a reduced power consumption of the memory device 110, or a reduced heating of the memory device 110, among other benefits.

Figure 3:
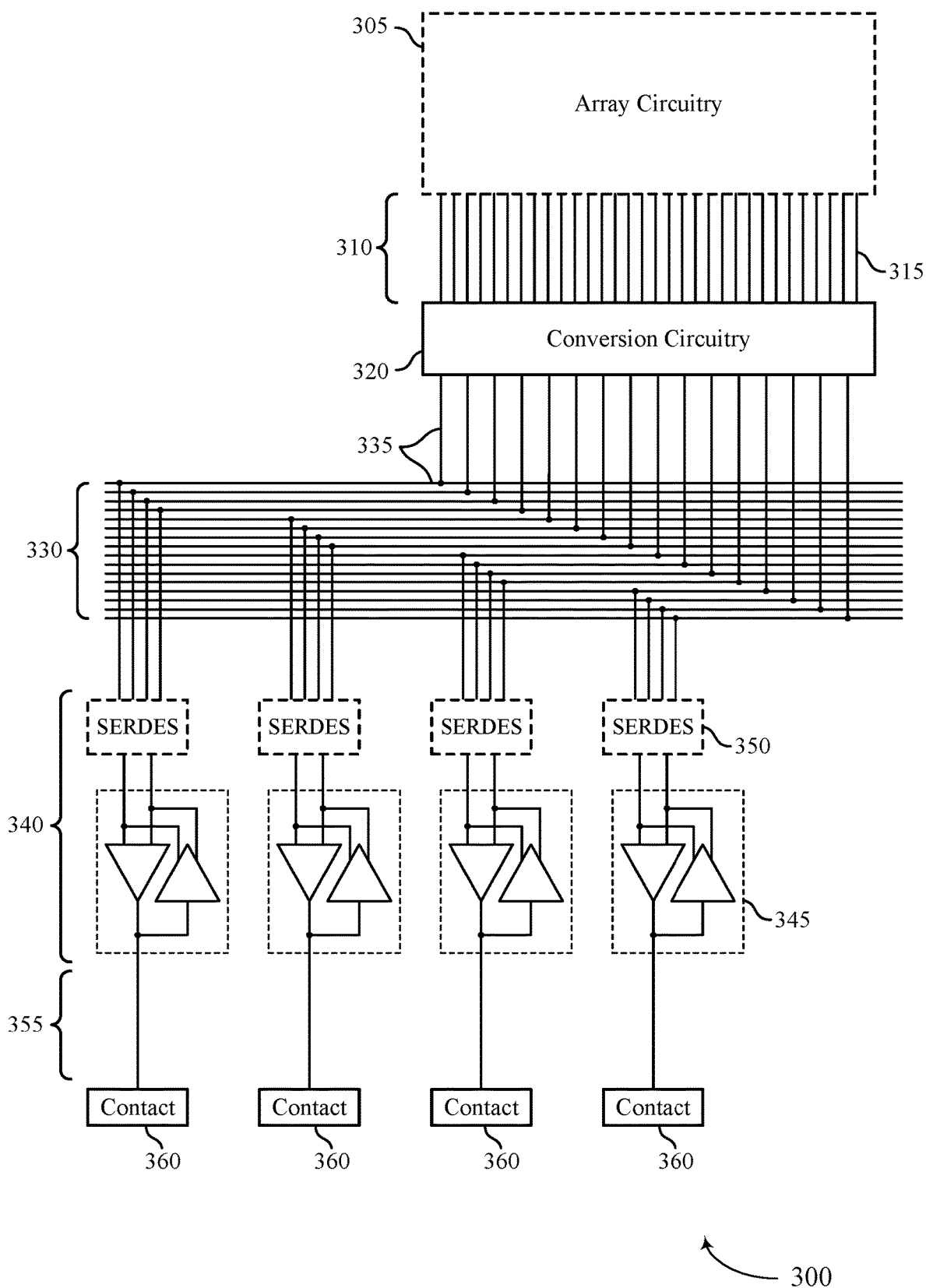
FIG. 3 illustrates an example of a data path that supports memory with parallel main and test interfaces in accordance with examples as disclosed herein.

FIG. 3 illustrates an example of a data path 300 that supports memory with parallel main and test interfaces in accordance with examples as disclosed herein. The data path 300 illustrates an example of circuitry of a memory die (e.g., a memory die 160, a memory die 200) that supports a communication of data between array circuitry 305 and a set of contacts 360. The array circuitry 305 may include a set of one or more memory arrays (e.g., a memory array 170, memory cells 205), as well as circuitry configured to access the array of memory cells (e.g., a row decoder 220, a column decoder 225, a sense component 245). The contacts 360 may be configured for communicating signals from or to the memory die, and may include various configurations of conductive interfaces (e.g., connection pads, solder pads, signaling contacts, bonding contacts, metal landing pads) that support a communicative coupling with another component.

Signals to and from the array circuitry 305 may be routed via signal paths 315 of a bus 310 (e.g., a first data bus), which may be a relatively dense metal interconnect region of a memory die, and which may be referred to as a global input/output (GIO) bus or a GIO interconnect. Signals of the bus 310 may be driven from the array circuitry 305 and detected by conversion circuitry 320, which may be supported by one or more analog data sense amp (DSA) circuits of the conversion circuitry 320. In some examples, such DSA circuits may translate a low-swing signal (e.g., signaling associated with a relatively smaller voltage range or relatively smaller drive strength, associated with signaling of the array circuitry 305, analog signaling) to a full swing signal (e.g., signaling associated with a relatively larger voltage range or relatively larger drive strength, digital signaling) associated with a bus 330 (e.g., a second data bus), which may be referred to as a data read-write (DRW) bus. In some examples, such a translation of low-swing signaling may be implemented in the conversion circuitry 320 because an amplification ability of the array circuitry 305 (e.g., an amplification ability of a sense component 245), or a parasitic loading of the bus 310 (e.g., of the signal paths 315), or a combination thereof may not support signal transitions occurring in accordance with a specified performance criteria (e.g., a speed criteria, a latency criteria, a criteria for signaling communicated to or from a memory device 110 that includes the data path 300). In some examples, each signal path 315 of the bus 310 may involve a separate DSA circuit of the conversion circuitry 320. The conversion circuitry 320 may also include write driver circuitry, which may support writing information to memory cells 205 of the array circuitry 305.

The conversion circuitry 320 may also include latches, drivers, and multiplexers that are compatible with full-swing signaling. For example, control logic may be implemented to provide clock signals to latches of the conversion circuitry such that a quantity of signals (e.g., a quantity of signal paths 315) on the bus 310 may be divided by the quantity of latches connected to the bus 330. In the example of data path 300, each signal path 335 of the bus 330 may be associated with two signal paths 315 of the bus 310, such that signaling of the bus 330 (e.g., DRW signaling) may be supported by latches, drivers, and multiplexers operating on the bus 330 at twice the frequency of transitions of the signaling on the bus 310 (e.g., GIO signaling) when memory cells of the array circuitry 305 are being read. Accordingly, a transfer of signals on the bus 310 to one-half the quantity of signals on the bus 330 may be supported by an interconnect density (e.g., pitch) of the bus 330 being half of the interconnect density of the bus 310. Such a ratio may also be implemented in the opposite direction, in which case signals driven on the bus 330 may be translated by the conversion circuitry 320 from higher bandwidth on the bus 330 to lower bandwidth on the bus 310 (e.g., when memory cells of the array circuitry 305 are being written). Although some examples of the data path 300 may be configured with a 2:1 ratio between the bus 310 and the bus 330, other examples of a data path in accordance with examples as disclosed herein may implement different ratios between a bus 310 and a bus 330.

In some examples, packaging of a memory die that includes the data path 300 may utilize I/O circuitry 340, including at least drivers 345, which may be implemented to drive electrical signals through the contacts 360 via a bus 355 (e.g., a third data bus) and, in some examples, through solder ball connections to an external interconnect. However, I/O circuitry 340 may occupy a relatively large area of the memory die, which may limit a density of contacts 360, and accordingly may limit a bandwidth of signals communicated to or from the memory die that includes the data path 300 (e.g., signals via contacts 360). For example, a bandwidth of signaling with a may be a function of the interconnect density (e.g., metal pitch and unit area) and a frequency of signal transitions, but an interconnect density of the bus 330 may be greater than a density of the contacts 360 (e.g., relatively granular I/O landing pads). Thus, to maintain bandwidth of data transfer between the on-die interconnect (e.g., of the bus 330) and external interconnects (e.g., of the contacts 360), the I/O circuitry 340 may also include or be associated with respective serializer/deserializer components 350 (e.g., a SERDES) associated with each contact 360. By including serializer/deserializer components 350, the density of contacts 360 may be reduced for a given bandwidth by supporting a proportional increase in the frequency of signals conveyed via contacts 360. Although some examples of the data path 300 may be configured with a 4:1 ratio between signal paths of the bus 330 and contacts 360, other examples of a data path in accordance with examples as disclosed herein may implement different ratios between signal paths of a bus 330 and contacts 360.

In some examples, performance characteristics of a memory die that includes the data path 300 may be evaluated via contacts 360, which may include an evaluation before the contacts 360 are coupled with corresponding contacts of another component (e.g., of another semiconductor die). For example, an evaluation probe may establish an electrical coupling with contacts 360 (e.g., based on physical contact between the evaluation probe and the contacts 360), and may issue commands to evaluate various operations or configurations of the array circuitry 305 (e.g., including write commands and read commands to evaluate performance of a memory array of the array circuitry 305). However, probing of the contacts 360 may cause damage such as deformation of the contacts 360, or a change in material composition of the contacts 360, which may render the contacts 360 less effective or inoperable for some types of interconnections between stacked memory dies 160 of a memory device 110.

In accordance with examples as disclosed herein, a memory die that includes the data path 300 may be configured with parallel interfaces (e.g., parallel sets of contacts) that may separately support evaluation operations (e.g., before or as part of assembly in a multiple-die stack) or access operations (e.g., after assembly in a multiple die stack, in response to commands from a host device 105). For example, at least some of the contacts of a memory die may be configured to support evaluation operations, but may not be configured for interconnection with another semiconductor die. Rather, to support such interconnection, the memory die may include a set of one or more other contacts, which may be electrically isolated from a set of one or more contacts used for evaluation operations. By including another set of contacts for such interconnection, evaluation operations such as probing may be performed without associated damage impairing an interconnection between semiconductor dies, which may improve design flexibility for configuring interconnection among the semiconductor dies.

In some examples of the described techniques, a memory die may include multiple sets of contacts 360 (e.g., redundant sets, duplicate sets), such that a first set of contacts 360 may be used for evaluation operations (e.g., via a first set of I/O circuitry 340) and a second set of contacts 360 may be used for interconnection with another semiconductor die (e.g., via the first set of I/O circuitry 340, via a second set of I/O circuitry 340). In some other examples, a memory die may include a set of contacts 360 for evaluation operations (e.g., using signaling via I/O circuitry 340), and a set of other contacts (not shown) for interconnection that supports a different signaling configuration (e.g., a different driver configuration, a different multiplexing configuration). In some other examples, a memory die may include a set of contacts 360 for interconnection (e.g., using signaling via I/O circuitry 340), and a set of other contacts (not shown) for evaluation operations that supports a different signaling configuration (e.g., a different driver configuration, a different multiplexing configuration).

In some examples, to support different sets of interfaces for evaluation and interconnection, a first set of contacts may be associated with signaling over a bus 330 via serializer/deserializer components 350, whereas a second set of contacts may not be associated with (e.g., may omit) serializer/deserializer components 350. Additionally, or alternatively, a first set of contacts may be associated with signaling via drivers 345, whereas a second set of contacts may not be associated with (e.g., may omit) drivers 345. For example, a set of contacts for interconnection with another semiconductor die may be implemented with a direct connection to a bus 330 (e.g., a direct DRW interconnection, which may implement drivers of conversion circuitry 320 to support signaling via interconnection contacts), or may be implemented with a direct connection to a bus 310 (e.g., a direct GIO interconnection, which may implement drivers of array circuitry 305, or signal amplification of a sense component 245, among other circuitry to support signaling via interconnection contacts), or some combination thereof. In some examples, such techniques may involve configurations of I/O circuitry that is different than the I/O circuitry 340 (e.g., which may be used to support an evaluation of the memory die via contacts 360). In some examples, a relatively higher density direct interconnection with the bus 330 or the bus 310 may be facilitated by not involving the same contacts for die interconnection and evaluation, which may also overcome limitations related to probe contact density (e.g., with or without associated evaluation probe damage), among other issues.

In some examples, I/O circuitry 340 associated with contacts 360 used for evaluation operations may be deactivated after performing the evaluation operations, which may include disabling such I/O circuitry 340 (e.g., by removing power from the I/O circuitry or otherwise deselecting the I/O circuitry 340), or electrically disconnecting such I/O circuitry 340 from the bus 330 (e.g., by opening one or more fused connections between the I/O circuitry 340 and the bus 330). In some examples, such techniques will reduce a power consumption of a memory die, or will reduce an associated heating of a memory die, compared with techniques that involve I/O circuitry 340 for communicating signaling via contacts 360 (e.g., compared to techniques that use I/O circuitry 340 for both evaluation operations and for signaling among semiconductor dies of a multiple-die stack).

Figure 4:
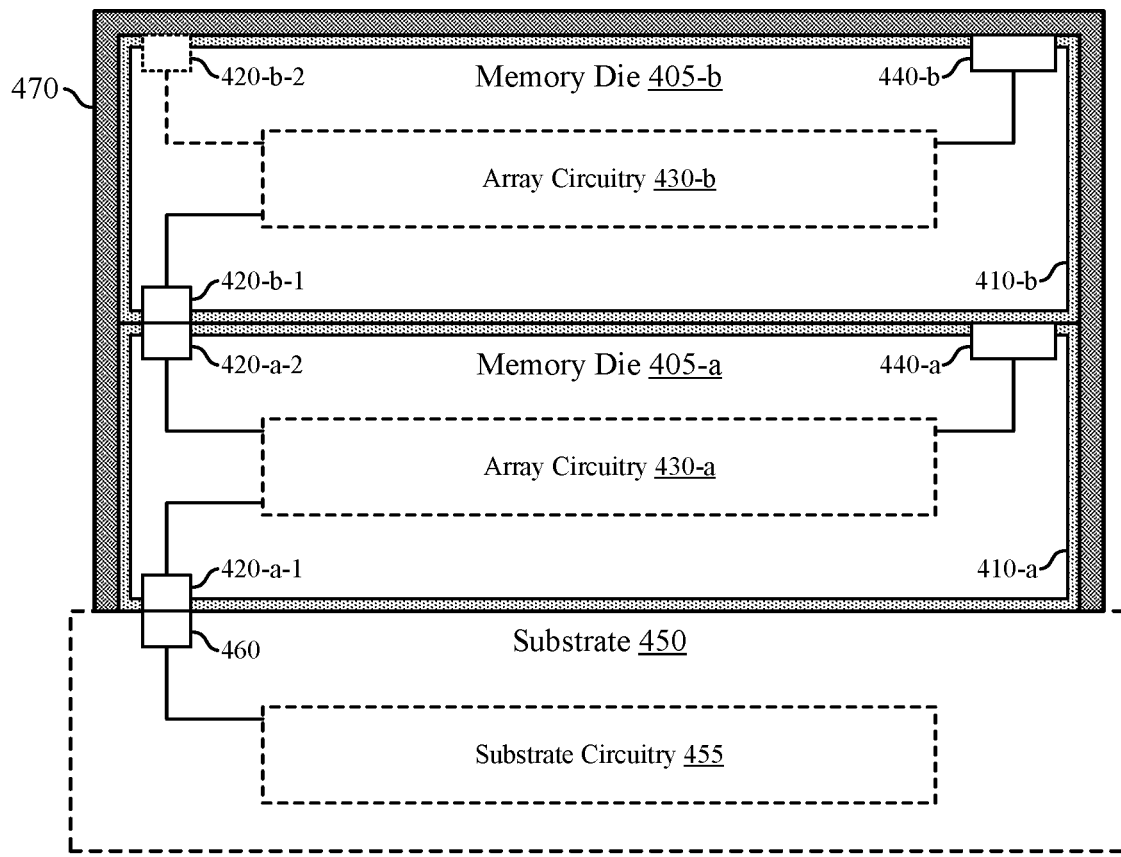
FIG. 4 illustrates an example of a device that supports memory with parallel main and test interfaces in accordance with examples as disclosed herein.

FIG. 4 illustrates an example of a device 400 that supports memory with parallel main and test interfaces in accordance with examples as disclosed herein. The device 400 includes memory dies 405-a and 405-b (e.g., a stack of memory dies, vertically interconnected memory dies, semiconductor dies), which may be examples of memory dies as described herein. In some examples, the device 400 may be an example of a memory device 110 described with reference to FIG. 1, although the device may be configured differently than a memory device 110 (e.g., as an integrated assembly including one or more memory dies integrated with one or more processor dies). Although described with reference to two memory dies 405, the device 400 may include any quantity or one or more memory dies 405.

Each of the memory dies 405 may include array circuitry 430, which may include a set of one or more memory arrays and various circuitry configured to operate the set of memory arrays. In some examples, array circuitry 430 may be an example of or may include array circuitry 305. Array circuitry 430 also may include various circuitry that supports communication of signaling outside the memory dies 405, such as a bus 310, conversion circuitry 320, a bus 330, I/O circuitry 340, or a bus 355, or any combination thereof.

Each of the memory dies 405 includes one or more contacts 420 that support routing signals external to the respective memory die 405 (e.g., contacts configured for communicative coupling with contacts of another semiconductor die, when assembled in a multiple-die stack). For example, the memory die 405-a may include a contact 420-a-1 (e.g., on a bottom surface of the memory die 405-a) and a contact 420-a-2 (e.g., on a top surface of the memory die 405-a), each of which may support an electrical connection with array circuitry 430-a through a dielectric portion 410-a of the memory die 405-a. Further, the memory die 405-b may include a contact 420-b-1 (e.g., on a bottom surface of the memory die 405-b) and a contact 420-b-2 (e.g., on a top surface of the memory die 405-a), each of which may support an electrical connection with array circuitry 430-b through a dielectric portion 410-b of the memory die 405-b. Although each of the memory dies 405 are illustrated with one contact 420 on a top surface and one contact 420 on a bottom surface, a memory die 405 of the device 400 may include any quantity of one or more contacts 420 on a top surface, or any quantity of one or more contacts 420 on a bottom surface, or may omit contacts 420 on one of a bottom surface or a top surface (e.g., omitting contact 420-b-2), among other configurations. Moreover, although each of the contacts 420 are illustrated as being electrically connected with array circuitry 430 of a given memory die 405, in some examples, contacts 420 may be configured to support a bypass connection through a memory die 405 (e.g., to communicate signaling through the memory die 405 without involvement or modification by the array circuitry 430, or otherwise bypassing the array circuitry 430 or functional components thereof).

In some examples, the device 400 may include a substrate 450, which may be a semiconductor die, or may be an organic substrate such as a printed circuit board (PCB), among other examples. A substrate 450 may include substrate circuitry 455, which may support various operations with the memory dies 405. For example, the substrate circuitry 455 may include a device memory controller 155, or a processor (e.g., of a processor die), among other circuitry, which may be coupled with one or more contacts 460 that are operable for communicating signaling with the memory die 405-*a*, or the memory die 405-*b*, or both. Although the substrate 450 is illustrated with a single contact 460, a substrate of the device 400 may include any quantity of one or more contacts 460, which may include respective sets of one or more contacts 460 that are dedicated to signaling with a given one of the memory dies 405. In some examples, the substrate 450 may also include contacts (not shown) configured for conveying signaling to or from the device 400, such as with a host device 105 (e.g., via channels 115) or other interfacing device.

The contacts 420 may be configured for various interconnection techniques between memory dies 405, or between a memory die 405 and a substrate 450, where applicable. For example, operations to manufacture the device 400 may include establishing a communicative coupling (e.g., an electrical coupling, a mechanical coupling, a bonding) between the contact 420-*b*-1 and the contact 420-*a*-2, and establishing a communicative coupling between the contact 420-*a*-1 and the contact 460. In some examples, contacts 420, or contacts 460, or both may be metal landing pads (e.g., at a relatively granular spacing) that accommodate soldered connections between memory dies 405. In some other examples, contacts 420, or contacts 460, or both may be configured to support direct connections (e.g., metal-to-metal connections) without a separate bonding material (e.g., a direct connection between material of the contact 420-*a*-2 and material of the contact 420-*b*-1, without a solder material, which may be referred to as a hybrid bond), which may be formed using pressure, heat, vibration, or any combination thereof. In some examples, a direct metal-to-metal connection may support higher density interconnection (e.g., supporting a relatively higher quantity of contacts 420 or contacts 460, supporting contacts 420 or 460 with a relatively smaller area, supporting location of contacts 420 or 460 in a relatively smaller area, or various combinations thereof) than would be supported by other techniques, such as soldered connections. For example, metal-to-metal connections may support contacts 420 being coupled with a bus 330 of array circuitry 430, or a bus 310 of array circuitry 430, among other examples. Such techniques may be combined with through-silicon vias (TSVs), for which an interconnect may be routed vertically through holes formed in passivation layers of the memory dies 405. In some examples, TSV implementations may avoid horizontal metal interconnection between memory dies that might otherwise be connected in a planar manner, which will conserve area and power associated with parasitic losses, or electrical impedance, or other phenomena. In some examples, relatively fine-pitch bonding via contacts 420 or contacts 460 may enable high-density interconnect for stacking the memory dies 405, including direct bonding to a processor (e.g., of a substrate 450, coupled with a substrate 450) for heterogeneous systems contained in the same package.

In some examples, stacking of memory dies 405 using fine-pitch bonding via contacts 420, or such stacking with a substrate 450 via contacts 460, where applicable, may overcome some electrical and physical limitations related to some techniques for interconnection (e.g., limitations related to solder ball techniques), which may support interconnections via contacts 420 or contacts 460 performing similarly to die-level metal connections. However, fine-pitch bonding may be associated with challenges for probing and testing stacked systems such as the device 400. For example, some probing techniques may involve a temporary connection to the testing equipment through contacts of a semiconductor die. In some examples, probing contacts 420 may be impractical, because the pitch and size of the contacts 420 may be incompatible with probe equipment. Moreover, physically contacting the contacts 420 with test signal probes may damage the contacts 420, which may cause the contacts 420 to be less effective or inoperable for interconnection (e.g., for metal-to-metal interconnection).

To support evaluation of the memory dies 405 without probing the contacts 420, each memory die 405 may also include one or more contacts 440 that are coupled with the array circuitry of the memory die 405. The contacts 440 may be configured for testing operations of memory dies 405 (e.g., before or as part of assembly in the device 400). In some examples, the contacts 440 may not be used for signaling when the memory dies 405 are assembled in the device 400 and, alternatively, may be configured for contact by an evaluation probe prior to such assembly.

The contacts 440 may be configured for electrical isolation from adjacent memory dies 405 (e.g., another memory die 405 of the stack, which may be directly or indirectly adjacent to or in contact with the contacts 440), or from a substrate 450, where applicable, or both. For example, as illustrated, the contact 440-*a* of the memory die 405-*a* may be configured to be in contact with the dielectric portion 410-*b* of the memory die 405-*b*, and the contact 440-*b* of the memory die 405-*b* may be configured to be in contact with a dielectric portion 470 of the device 400, which may be a dielectric coating (e.g., a conformal coating) over at least the stack of memory dies 405. In some examples, the contacts 440 may be configured to be physically inaccessible after assembly in the device 400 (e.g., physically covered by another component, physically covered by a dielectric covering).

In some examples, the contacts 420 and the contacts 440 may be associated with different geometric characteristics (e.g., different cross-sectional areas, different contact areas, different pitch dimensions). For example, the contacts 420 may be relatively small, or may be separated by a relatively small pitch dimension (e.g., on the order of a pitch of a bus 310, on the order of a pitch of a bus 330, a pitch of 12 microns or less, a pitch of 6 microns or less, a pitch of 3 microns or less), or both, which may support a relatively greater quantity of contacts 420 in a given area (e.g., to support a higher quantity of signal paths that may support a relatively higher throughput of the device 400, to support a relatively high interconnection density). The contacts 420 may be relatively large, or may be separated by a relatively large pitch dimension (e.g., on the order of a pitch of a bus 355, a pitch of 12 microns or more, a pitch of 6 microns or more, a pitch of 3 microns or more), or both, which may facilitate a communicative coupling with an evaluation probe. In some examples, contacts 420 and contacts 440 may be located in different regions of a memory die 405. For example, contacts 420 may be located relatively close to memory arrays or supporting circuitry of the array circuitry 430 (e.g., to preferentially reduce signal degradation in the as-assembled condition), whereas contacts 460 may be located relatively farther from the array circuitry 430 in an area reserved for probing (e.g., relatively close to an evaluation interface of the array circuitry 430, such as an IEEE1500 interface).

In some examples, a memory die 405 may include subsets of contacts for different purposes. For example, to support operations in an assembled state of the device 400 (e.g., to support signaling from or via a substrate 450, to support signaling with a device memory controller 155 of the substrate circuitry 455), a memory die 405 may include a subset of contacts 420 that are configured for control signaling associated with operating the memory die 405 (e.g., configuration signaling, commands to access a memory array of the array circuitry 430), a subset of contacts 420 that are configured for data signaling associated with operating the memory die 405 (e.g., via a data bus), or a subset of contacts that are associated with receiving power, or various combinations thereof. To support evaluation operations (e.g., prior to assembly of the device 400, to support signaling from or via an evaluation probe), a memory die 405 may include a subset of contacts 440 that are configured for control signaling associated with evaluating the memory die 405 (e.g., configuration signaling, commands to access a memory array of the array circuitry 430), a subset of contacts 440 that are configured for data signaling associated with evaluating the memory die 405 (e.g., via a data bus), or a subset of contacts that are associated with receiving power, or various combinations thereof. In some examples, the contacts 420 and the contacts 440 may be coupled with different data buses of a memory die 405. For example, contacts 440 may be coupled with a bus 355 (e.g., a relatively granular bus of a memory die 405, in which case the contacts 440 may be an example of contacts 360), whereas contacts 420 may be coupled with a bus 330, or a bus 310, among other examples.

Figure 5:
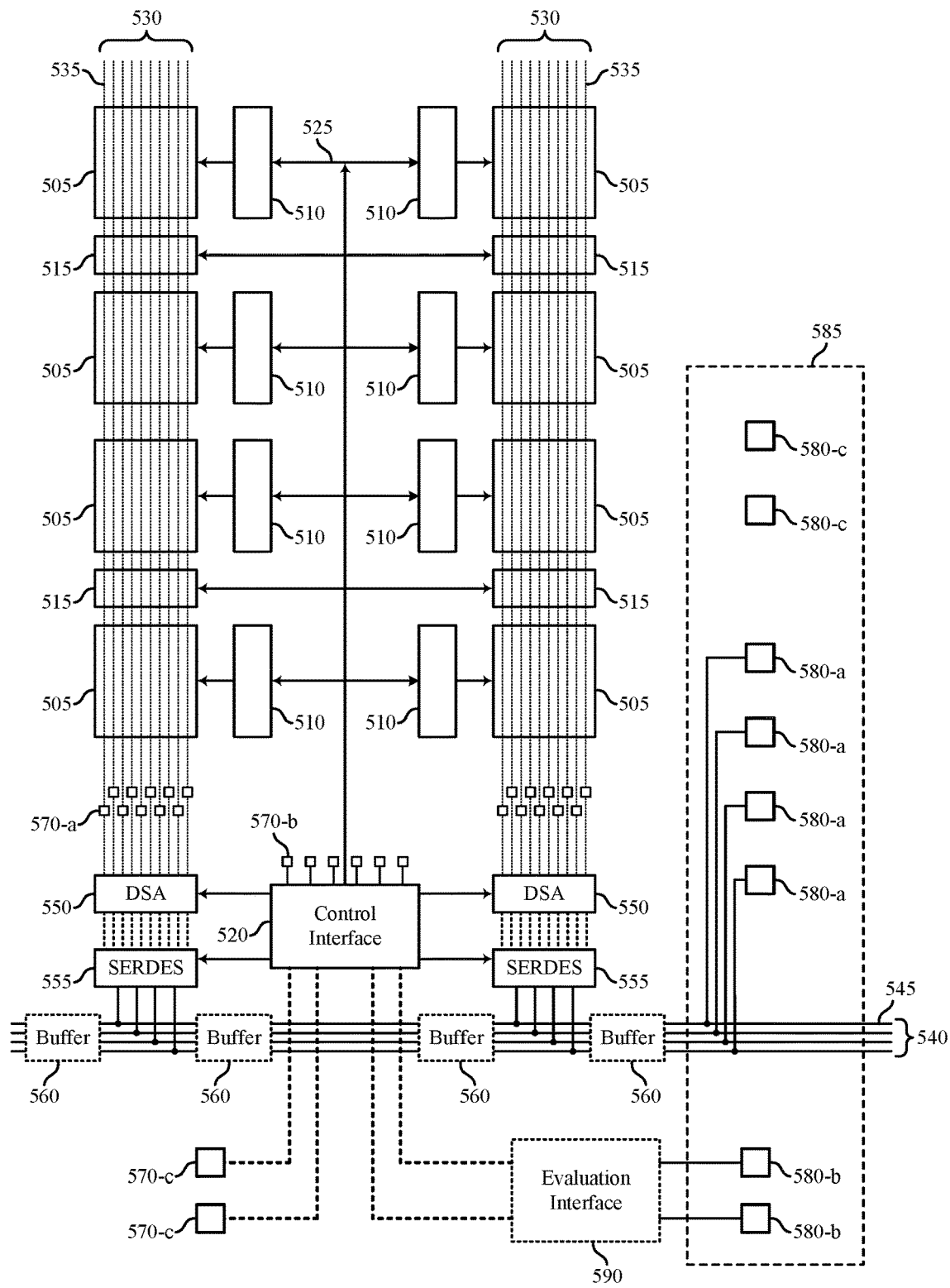
FIG. 5 illustrates an example of a layout that supports memory with parallel main and test interfaces in accordance with examples as disclosed herein.

FIG. 5 illustrates an example of a layout 500 that supports memory with parallel main and test interfaces in accordance with examples as disclosed herein. The layout 500 illustrates an example of circuitry that may be implemented in a semiconductor die, such as a memory die (e.g., a memory die 160, a memory die 200, a memory die 405), which may include a first set of contacts configured for communicative coupling with another semiconductor die (e.g., as assembled in stack of semiconductor dies) and a second set of contacts configured for evaluation operations of the semiconductor die (e.g., before or as part of assembly in a stack of semiconductor dies).

The layout 500 includes a set of memory arrays 505, which each may include an array of memory cells (e.g., memory cells 205) in accordance with various memory architectures. For example, memory cells of the memory arrays 505 may include capacitive storage elements (e.g., DRAM memory cells), ferroelectric storage elements (e.g., FeRAM memory cells), chalcogenide storage elements (e.g., phase change memory cells, thresholding memory cells), transistor-based storage elements (e.g., NAND memory cells, SRAM memory cells), among other types of storage elements.

Each memory array 505 may be associated with row circuitry 510, each instance of which may include components such as a row decoder, a row driver, a row access strobe, or bank logic, among other circuitry that may be associated with accessing rows of memory cells (e.g., accessing word lines 210). Each memory array 505 also may be associated with column circuitry 515, each instance of which may include components such as a column decoder, a column driver, a column access strobe, or a sense component, among other circuitry that may be associated with accessing columns of memory cells (e.g., accessing digit lines 215). Operations of the row circuitry 510 and the column circuitry 515 may be controlled via a control interface 520, which may be supported via signaling over a control bus 525 that is coupled with the row circuitry 510 and the column circuitry.

In some examples, the layout 500 may include one or more buses 530 that may be operable for coupling with a set of one or more instances of column circuitry 515. Each bus 530 may include a set of signal paths 535, and may be an example of a bus 310 (e.g., a GIO bus) described with reference to FIG. 3. In some examples (e.g., to support signaling of read operations on a memory array 505), signaling of a bus 530 may be driven by a component of a corresponding instance of column circuitry 515, such as a set of sense amplifiers coupled with the signal paths 535 and respective memory cells being read.

The layout 500 also may include a bus 540 that may be operable for coupling with one or more of the buses 530. The bus 540 may include a set of signal paths 545, and may be an example of a bus 330 (e.g., a DRW bus) or a bus 355 described with reference to FIG. 3. In some examples (e.g., to support signaling of read operations on a memory array 505), signaling of a bus 540 may be driven at least in part by a data sense amplifier 550, which may be associated with translations between relatively low-swing signaling of the bus 530 (e.g., analog signaling) and full-swing signaling of the bus 540 (e.g., digital signaling). In some examples, a quantity of signal paths 545 of the bus 540 may be less than a quantity of signal paths 535 of the bus 530, which may be supported by a serializer/deserializer component 555 (e.g., between the bus 540 and a bus 530. In various examples, operations of the data sense amplifiers 550, the serializer/deserializer components 555, or both may be controlled vial the control interface 520.

The layout 500 may include contacts 570, which may be configured for communicative coupling with contacts of another semiconductor die (e.g., in a multiple-die stack). In some examples, contacts 570-a may support data signaling with or via another semiconductor die, and may support a direct connection with the bus 530. In some examples, contacts 570-b may support control signaling with or via another semiconductor die (e.g., including a device memory controller 155 or another type of processor), which may include control signaling communicated with the control interface 520. In some examples, contacts 570-c may support power delivery to the layout 500 (e.g., from or via a substrate 450, in accordance with one or more voltage levels), which may be routed via the control interface 520, among other portions of the layout 500. In some examples, contacts 570 may have a relatively small contact area, or may be associated with a relatively small pitch dimension between contacts, or both, which may support a relatively large quantity of contacts between semiconductor dies (e.g., to support relatively high throughput of signaling while avoiding power consumption and heat generation associated with data sense amplifiers 550 and serializer/deserializer components 555, among other circuitry). In some examples, contacts 570 may include bypass contacts that are configured to convey signaling through a semiconductor die that includes the layout 500, which may not be coupled with circuitry of the layout 500

The layout 500 also may include contacts 580, which may be configured for evaluation operations associated with the layout 500 (e.g., before a semiconductor die including the layout 500 is coupled with another semiconductor die). In some examples, the contacts 580 may be electrically isolated from the contacts 570. In some examples, one or more of the contacts 580 may be included in a region 585 (e.g., a common logic and test access block, a test probe region, a reserved area of the semiconductor die). In some examples, contacts 580-a may support data signaling with an evaluation probe, and may support a connection with the bus 540 (e.g., utilizing a more granular DRW bus to facilitate observation points in the layout 500). In some examples, contacts 580-*b* may support control signaling with an evaluation probe. In some examples, contacts 580-*c* may support power delivery to the layout 500 (e.g., from or via an evaluation probe, in accordance with one or more voltage levels), which also may be routed via the control interface 520, among other portions of the layout 500. In some examples, contacts 580 may have a relatively large contact area, or may be associated with a relatively large pitch dimension between contacts, or both, which may facilitate coupling with an evaluation probe.

In some examples, control signaling via contacts 580-*b* may include signaling with an evaluation interface 590, which may translate or otherwise respond to signaling via the contacts 580-*b* (e.g., from an evaluation probe) by generating control signaling for operations with the control interface 520. For example, an evaluation probe coupled with the contacts 580-*b* may transmit control signaling (e.g., commands to access the memory arrays 505) to the evaluation interface 590 to invoke evaluation protocols (e.g., configuration settings, data patterns, access patterns, registers), which may be associated with instructions stored at the evaluation interface 590. Such protocols may be called to initiate various access sequences by the control interface 520 for accessing the memory arrays 505, which may include various techniques for encoding or compressing signaling via the contacts 580. In some examples, the evaluation interface 590 may provide customer-facing access to the layout 500, such as an IEEE1500 interface or other proprietary access logic.

In some examples, the bus 540 may be associated with buffers 560 (e.g., buffer circuits, which may amplify signals through inverters), which may support extending the bus 540 across a semiconductor die to support access by different sections of the memory logic. The buffers 560 may be bidirectional, which may support amplifying signals both left and right of a channel for reading from the memory arrays 505 or writing to the memory arrays 505. Buffers 560 may be included in various configurations along the bus 540 (e.g., between portions of the bus 540 and interconnections with one or more buses 530) to support various functionality of the layout 500. For example, the buffers 560 may be activated or deactivated, for various signaling or evaluations, which may include activations or deactivations by the control interface 520 (e.g., in response to data access commands), or by the evaluation interface 590 (e.g., in response to evaluation commands), or both, which may include commands to activate one or more of the buffers 560.

In some examples, the buffers 560 may support isolating one or more sections of the bus 540 for use in a mission mode (e.g., when a semiconductor die including the layout 500 is assembled in a multiple-die stack, for signaling operational data rather than an evaluation mode), which may reduce a loading of driver circuits involved with accessing data. In some examples, the buffers 560 may support amplifying data signals so they can be observed at contacts 580-*a*, or through registers accessed through the evaluation interface 590. Although the contacts 580 may not be accessible after assembling a multiple-die stack, in some examples, signals of the bus 540 may be otherwise made available after assembly through other bonds (e.g., other contacts of the layout 500, not shown), which may support other connections with an evaluation interface 590 (e.g., IEEE1500 interface logic) that may be evaluated by an end user.

In some examples, accessing sections of the bus 540 may be supported by programming (e.g., configuring, enabling) buffers 560 to turn on signal paths corresponding to memory arrays 505 and physical interface of the memory channel to be observed, which may be performed via a bus interconnect associated with the evaluation interface 590. For example, test circuit operation may be verified during a manufacturing test for reliability both before or as part of assembly in a multiple-die stack and after such assembly, which may include verifying continuity of the bond connections to the test circuit. In some examples, such evaluations may be relatively minor compared with creating test circuits for verifying bond connections for the many connections involved with memory access. Once the test logic is verified, post packaging, the test circuit may then be used for verifying the bond connections of a multiple-die stack using the more simplified test logic interface. In some examples, after assembling a multiple-die stack, one or more of the bus 540, the buffers 560, the serializer/deserializer components 555, or the data sense amplifiers 550 may be disabled which may reduce a power consumption or heat loading of the assembled stack.

Thus, in accordance with these and other examples, a semiconductor die may include one or more memory arrays, a set of first contacts (e.g., contacts 580) that are configured for signaling associated with operating the one or more memory arrays in accordance with a first mode (e.g., for evaluation operations, before coupling the first semiconductor die with a second semiconductor die), and a set of second contacts (e.g., contacts 570) that are configured for signaling associated with operating the one or more memory arrays in accordance with a second mode (e.g., a mission mode, after coupling the first semiconductor die with a second semiconductor die). By implementing such sets of contacts, the layout 500 may support evaluation operations using the set of first contacts without damaging the set of second contacts, which may improve capabilities of the layout 500 for supporting a multiple-die stack. In some examples, such configurations may support a higher throughput (e.g., a higher bit rate, a higher burst rate) via the set of first contacts, a reduced power consumption of the semiconductor die, or a reduced heating of the semiconductor die, among other benefits.

Figure 6:
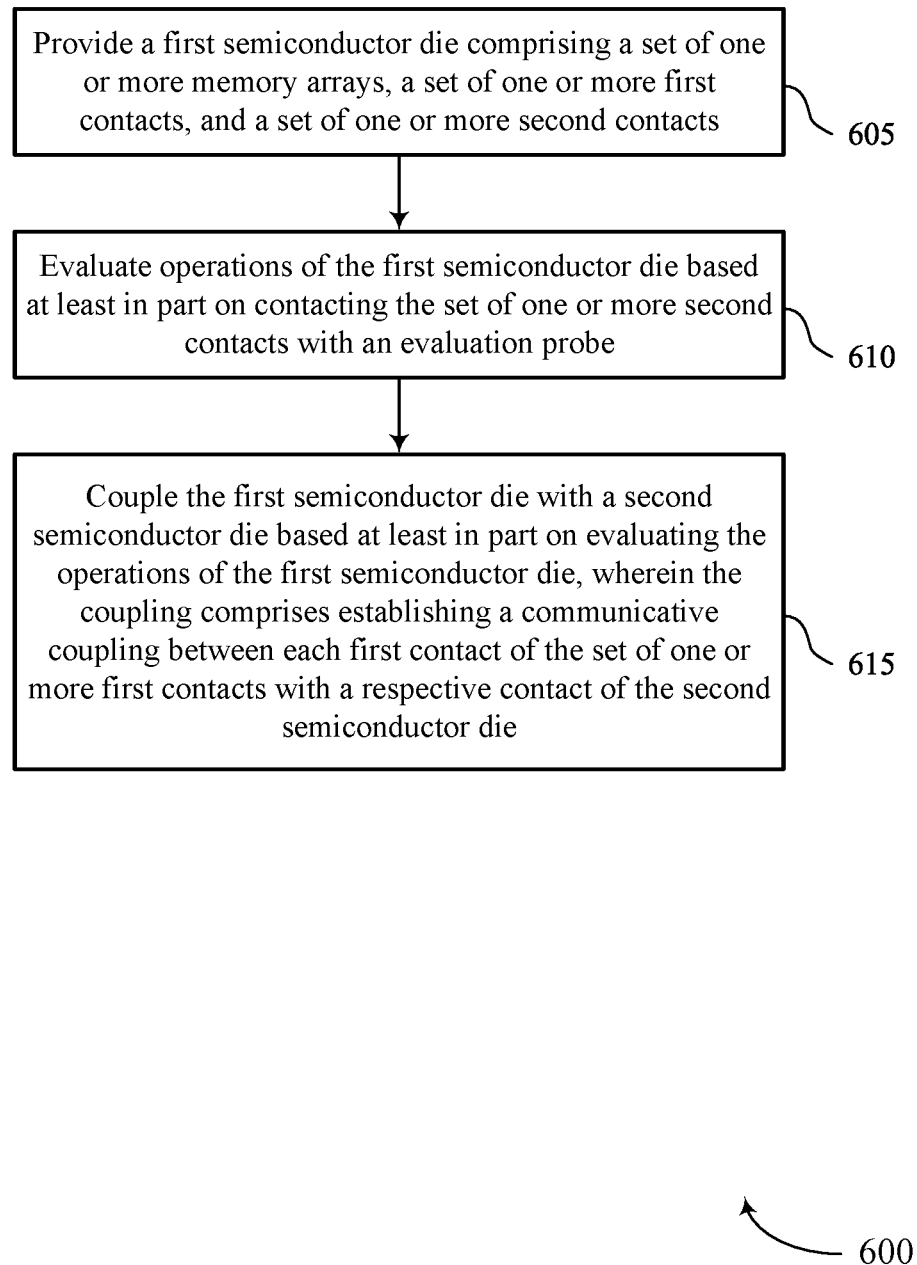
FIG. 6 shows a flowchart illustrating a method or methods that support memory with parallel main and test interfaces in accordance with examples as disclosed herein.

FIG. 6 shows a flowchart illustrating a method 600 that supports memory with parallel main and test interfaces in accordance with examples as disclosed herein. The operations of method 600 may be implemented by a manufacturing system or its components as described herein. In some examples, a manufacturing system may execute a set of instructions to control the functional elements of the device to perform the described functions. Additionally, or alternatively, the manufacturing system may perform aspects of the described functions using special-purpose hardware.

At 605, the method may include providing a first semiconductor die including a set of one or more memory arrays, a set of one or more first contacts, and a set of one or more second contacts. The operations of 605 may be performed in accordance with examples as disclosed with reference to FIGS. 3 through 5.

At 610, the method may include evaluating operations of the first semiconductor die based at least in part on contacting the set of one or more second contacts with an evaluation probe. The operations of 610 may be performed in accordance with examples as disclosed with reference to FIGS. 3 through 5.

At 615, the method may include coupling the first semiconductor die with a second semiconductor die based at least in part on evaluating the operations of the first semiconductor die, where the coupling includes establishing a communicative coupling between each first contact of the set of one or more first contacts with a respective contact of the second semiconductor die. The operations of 615 may be performed in accordance with examples as disclosed with reference to FIGS. 3 through 5.

In some examples, an apparatus (e.g., a manufacturing system) as described herein may perform a method or methods, such as the method 600. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method, apparatus, or non-transitory computer-readable medium including operations, features, circuitry, logic, means, or instructions, or any combination thereof for providing a first semiconductor die including a set of one or more memory arrays, a set of one or more first contacts, and a set of one or more second contacts; evaluating operations of the first semiconductor die based at least in part on contacting the set of one or more second contacts with an evaluation probe; and coupling the first semiconductor die with a second semiconductor die based at least in part on evaluating the operations of the first semiconductor die, where the coupling includes establishing a communicative coupling between each first contact of the set of one or more first contacts with a respective contact of the second semiconductor die.

Aspect 2: The method, apparatus, or non-transitory computer-readable medium of aspect 1, further including operations, features, circuitry, logic, means, or instructions, or any combination thereof for providing power to the first semiconductor die via a first subset of the set of one or more second contacts, where the evaluating is based at least in part on the provided power.

Aspect 3: The method, apparatus, or non-transitory computer-readable medium of any of aspects 1 through 2, further including operations, features, circuitry, logic, means, or instructions, or any combination thereof for providing commands to access at least one of the one or more memory arrays of the first semiconductor die via a second subset of the set of one or more second contacts, where the evaluating is based at least in part on the commands to access the at least one of the one or more memory arrays.

Aspect 4: The method, apparatus, or non-transitory computer-readable medium of any of aspects 1 through 3, further including operations, features, circuitry, logic, means, or instructions, or any combination thereof for providing the commands to access the at least one of the one or more memory arrays to evaluation interface circuitry of the first semiconductor die.

Aspect 5: The method, apparatus, or non-transitory computer-readable medium of any of aspects 1 through 4 where at least a subset of the one or more first contacts are coupled with a first data bus of the first semiconductor die and at least a subset of the one or more second contacts are coupled with one or more second data buses of the first semiconductor die.

Aspect 6: The method, apparatus, or non-transitory computer-readable medium of aspect 5, further including operations, features, circuitry, logic, means, or instructions, or any combination thereof for providing commands to activate one or more buffers between the first data bus and the one or more second data buses, where the evaluating is based at least in part on the commands to activate the one or more buffers.

Aspect 7: The method, apparatus, or non-transitory computer-readable medium of any of aspects 1 through 6, further including operations, features, circuitry, logic, means, or instructions, or any combination thereof for providing the first semiconductor die including a second set of one or more first contacts and coupling the first semiconductor die with a third semiconductor die, where the coupling includes establishing a communicative coupling between each first contact of the second set of one or more first contacts with a respective contact of the third semiconductor die.

Aspect 8: The method, apparatus, or non-transitory computer-readable medium of any of aspects 1 through 7, further including operations, features, circuitry, logic, means, or instructions, or any combination thereof for providing the second semiconductor die including a second set of one or more one or more memory arrays.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 9: An apparatus, including: a set of one or more memory arrays of a first memory die; a set of one or more first contacts of the first memory die that are configured for communicative coupling with a set of one or more contacts of a second memory die; and a set of one or more second contacts of the first memory die that are configured for testing operations of the first memory die, where the set of one or more second contacts of the first memory die is configured for electrical isolation from circuitry of the second memory die.

Aspect 10: The apparatus of aspect 9, where: at least a subset of the one or more first contacts are coupled with a first data bus of the first memory die; and at least a subset of the one or more second contacts are coupled with one or more second data buses of the first memory die.

Aspect 11: The apparatus of aspect 10, further including one or more buffers between the first data bus and the one or more second data buses.

Aspect 12: The apparatus of any of aspects 10 through 11, further including one or more serializer/deserializer components between the first data bus and the one or more second data buses.

Aspect 13: The apparatus of any of aspects 9 through 12, where the set of one or more second contacts of the first memory die are configured to be physically inaccessible after the communicative coupling.

Aspect 14: The apparatus of any of aspects 9 through 13, where the set of one or more second contacts of the first memory die is configured for contact with a dielectric portion of the second memory die.

Aspect 15: The apparatus of any of aspects 9 through 14, where the set of one or more second contacts of the first memory die are configured for contact by an evaluation probe prior to the communicative coupling.

Aspect 16: The apparatus of any of aspects 9 through 15, where a first subset of the one or more second contacts is configured for control signaling associated with operating the first memory die and a second subset of the one or more second contacts is configured for data signaling associated with operating the first memory die.

Aspect 17: The apparatus of any of aspects 9 through 16, where a third subset of the set of one or more second contacts is configured for receiving power for operating the first memory die.

Aspect 18: The apparatus of any of aspects 9 through 17, where the set of one or more first contacts of the first memory die is configured for a soldered connection with the one or more contacts of the second memory die.

Aspect 19: The apparatus of any of aspects 9 through 18, where the set of one or more first contacts of the first memory die is configured for a direct connection with the one or more contacts of the second memory die.

Aspect 20: The apparatus of any of aspects 9 through 19, where the set of one or more first contacts of the first memory die is configured for conveying data signaling, command signaling, or a combination thereof.

Aspect 21: The apparatus of any of aspects 9 through 20, where the set of one or more first contacts of the first memory die is configured for communicating signaling with a controller communicatively coupled with the first memory die and with the second memory die.

Aspect 22: The apparatus of any of aspects 9 through 21, where the set of one or more first contacts of the memory is associated with a first pitch between the first contacts and the set of one or more second contacts are configured with a second pitch between the second contacts that is different than the first pitch.

Aspect 23: The apparatus of any of aspects 9 through 22, where the one or more first contacts of the memory are associated with a first cross-sectional area and the one or more second contacts are associated with a second cross-sectional area that is different than the first cross-sectional area.

An apparatus is described. The following provides an overview of aspects of the apparatus as described herein:

Aspect 24: An apparatus, including: a first semiconductor die of a memory device including a first set of one or more memory arrays, a first set of one or more first contacts, and a first set of one or more second contacts that are configured for evaluating operations of the first semiconductor die; and a second semiconductor die of the memory device including a second set of one or more memory arrays, a second set of one or more first contacts communicatively coupled with the first set of one or more first contacts, and a second set of one or more second contacts that are configured for evaluating operations of the second semiconductor die.

Aspect 25: The apparatus of aspect 24, where: at least a subset of the one or more first contacts of the first semiconductor die are coupled with a first data bus of the first semiconductor die; at least a subset of the one or more first contacts of the second semiconductor die are coupled with a first data bus of the second semiconductor die; at least a subset of the one or more second contacts of the first semiconductor die are coupled with one or more second data buses of the first semiconductor die; and at least a subset of the one or more second contacts of the second semiconductor die are coupled with one or more second data buses of the second semiconductor die.

Aspect 26: The apparatus of any of aspects 24 through 25, where the first set of one or more second contacts, the second set of one or more second contacts, or both are physically inaccessible while the second set of one or more first contacts is communicatively coupled with the first set of one or more first contacts.

Aspect 27: The apparatus of any of aspects 24 through 26, where: the first set of one or more second contacts is in contact with a dielectric portion of the second semiconductor die.

Aspect 28: The apparatus of any of aspects 24 through 27, further including: a substrate including a third set of one or more first contacts, where the first semiconductor die includes a fourth set of one or more first contacts communicatively coupled with the third set of one or more first contacts.

An apparatus is described. The following provides an overview of aspects of the apparatus as described herein:

Aspect 29: An apparatus, including: a set of one or more memory arrays of a first semiconductor die; a set of one or more first contacts of the first semiconductor die that are configured for signaling associated with operating the one or more memory arrays before coupling the first semiconductor die with a second semiconductor die; and a set of one or more second contacts of the first semiconductor die that are configured for signaling associated with operating the one or more memory arrays after coupling the first semiconductor die with the second semiconductor die.

An apparatus is described. The following provides an overview of aspects of the apparatus as described herein:

Aspect 30: An apparatus, including: a set of one or more memory arrays of a first semiconductor die; a set of one or more first contacts of the first semiconductor die that are configured for signaling associated with operating the one or more memory arrays in accordance with a first mode; and a set of one or more second contacts of the first semiconductor die, separate from the set of one or more first contacts, that are configured for signaling associated with operating the one or more memory arrays in accordance with a second mode.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a set of one or more memory arrays of a first memory die;
   a set of one or more first contacts of the first memory die that are configured for communicative coupling, during assembly of the apparatus, with a set of one or more contacts of a second memory die, at least a subset of the set of one or more first contacts coupled with a first data bus of the first memory die; and
   a set of one or more second contacts of the first memory die that are configured for pre-assembly testing operations of the first memory die, wherein the pre-assembly testing operations occur before the assembly of the apparatus comprising the communicative coupling of the set of one or more first contacts of the first memory die with the set of one or more contacts of the second memory die, wherein at least a subset of the set of one or more second contacts coupled with one or more second data buses of the first memory die, and wherein the set of one or more second contacts of the first memory die is electrically isolated from circuitry of the second memory die and the set of one or more second contacts of the first memory die is in contact with a dielectric portion of the second memory die based at least in part on the assembly of the apparatus comprising the communicative coupling.

2. The apparatus of claim 1, further comprising one or more buffers between the first data bus and the one or more second data buses.

3. The apparatus of claim 1, further comprising one or more serializer/deserializer components between the first data bus and the one or more second data buses.

4. The apparatus of claim 1, wherein the set of one or more second contacts of the first memory die are configured for contact by an evaluation probe prior to the communicative coupling.

5. The apparatus of claim 1, wherein a first subset of the set of one or more second contacts is configured for control signaling associated with operating the first memory die and a second subset of the set of one or more second contacts is configured for data signaling associated with operating the first memory die.

6. The apparatus of claim 1, wherein a third subset of the set of one or more second contacts is configured for receiving power for operating the first memory die.

7. The apparatus of claim 1, wherein the set of one or more first contacts of the first memory die is configured for a soldered connection with the set of one or more contacts of the second memory die.

8. The apparatus of claim 1, wherein the set of one or more first contacts of the first memory die is configured for a direct connection with the set of one or more contacts of the second memory die.

9. The apparatus of claim 1, wherein the set of one or more first contacts of the first memory die is configured for conveying data signaling, command signaling, or a combination thereof.

10. The apparatus of claim 1, wherein the set of one or more first contacts of the first memory die is configured for communicating signaling with a controller communicatively coupled with the first memory die and with the second memory die.

11. The apparatus of claim 1, wherein the set of one or more first contacts of the first memory die is associated with a first pitch between each first contact of the set of one or more first contacts and the set of one or more second contacts is configured with a second pitch between each second contact of the set of one or more second contacts that is larger than the first pitch.

12. The apparatus of claim 1, wherein the set of one or more first contacts of the first memory die is associated with a first cross-sectional area and the set of one or more second contacts is associated with a second cross-sectional area that is larger than the first cross-sectional area.

* * * * *